US006233713B1

(12) United States Patent
Van Den Berghe et al.

(10) Patent No.: US 6,233,713 B1
(45) Date of Patent: May 15, 2001

(54) METHOD AND APPARATUS FOR REAL-TIME DETERMINATION OF SCALABLE CHANNEL CODING SCHEME PARAMETERS

(75) Inventors: Larry Van Den Berghe, Burlington (CA); See Mong Si, Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 09/248,329

(22) Filed: Feb. 10, 1999

(30) Foreign Application Priority Data

Aug. 24, 1998 (SG) .................................................. 9803277-4

(51) Int. Cl.[7] .................................................. H03M 13/35
(52) U.S. Cl. ........................................... 714/790; 714/774
(58) Field of Search ...................................... 714/774, 790

(56) References Cited

U.S. PATENT DOCUMENTS

| | | | |
|---|---|---|---|
| 4,414,667 | 11/1983 | Bennett | 371/37 |
| 4,489,418 | 12/1984 | Mazo | 375/26 |
| 4,623,999 | 11/1986 | Patterson | 371/37 |
| 5,587,710 | 12/1996 | Choo et al. | 341/107 |
| 5,596,589 | 1/1997 | Thomsen et al. | 371/37.8 |

OTHER PUBLICATIONS

Cox et al., "Subband Speech Coding and Matched Convolutional Channel Coding for Mobile Radio Channels", IEEE Trans. on Signal Processing, vol. 39, No. 8, Aug. 1991, pp. 1717–1731.*

Bernard et al., "Channel Adaptive Joint Source–Channel Coding of Speech", 32nd Ansilomar Conf. on Signals, Systems & Computers, Nov. 1998, pp. 357–361.*

Chishtie, Mansoor A., "A TMS320C53–Based Enhanced Forward Error–Correction Scheme for U.S. Digital Cellular Radio."

Chishtie, Mansoor A., "U.S. Digital Cellular Error–Correcting Coding Algorithm Implementation on the TMS320C5x."

* cited by examiner

Primary Examiner—Stephen M. Baker
(74) Attorney, Agent, or Firm—Proskauer Rose LLP

(57) ABSTRACT

A digital cellular telephone using a scalable channel coding scheme includes a memory arranged as a three-dimensional code book. The three-dimensional code book may receive the following three input variables:

1. The number of bit classes;
2. The number of bits per frame to be coded; and
3. The available size of the output codeword based on available channel capacity.

For each of these input variables, the three-dimensional code book may output the following scalable coding parameters:

1. The number of bits per frame are partitioned into each of the coding classes; and
2. The puncture code per class.

The invention provides the scalable coding parameters in real-time. It does this, however, without calculating the parameters in real-time. The memory may be arranged in the following manner. A number of information bits to be coded is determined by a mode of the transmission signal. For each mode, entries are maintained for each channel availability from a minimum value to a maximum values for a particular mode. For each channel availability entry, the scalable coding parameters for each bit class is maintained.

15 Claims, 5 Drawing Sheets

FIG. 6B

| PUNCTURE CODE INDEX | |
|---|---|
| 1 | PUNCTURE CODE 1 |
| 2 | PUNCTURE CODE 2 |
| 3 | PUNCTURE CODE 3 |
| 4 | PUNCTURE CODE 4 |
| ⋮ | ⋮ |
| N | PUNCTURE CODE N |

750

METHOD AND APPARATUS FOR REAL-TIME DETERMINATION OF SCALABLE CHANNEL CODING SCHEME PARAMETERS

BACKGROUND OF THE INVENTION

1. Field of the Invention

The present invention relates to channel coders for digital wireless communications devices. More particularly, the present invention provides a method and apparatus for a digital wireless communications device to determine in real-time certain scalable channel coding scheme parameters. In a preferred embodiment, a memory is arranged as a three-dimensional code book which provides the appropriate scheme parameters in real-time without calculating the parameters in real-time.

2. Discussion of Related Art

FIG. 1 is a simplified block diagram of a transmission portion of a digital wireless communications device 100. One such device is a digital cellular phone which may be used with a TMS320C5x digital signal processor made by Texas Instruments, Dallas, Tex. or other suitable processor. A preferred digital cellular phone may include a microphone 102, an analog-to-digital converter (ADC) 104, a speech coder 106, a channel coder 108, a modulator/transmitter 110, and an antenna 120.

The transmission portion of the digital cellular device 100 of FIG. 1 may operate in the following manner. A sound, such as a speaker's voice, is detected by the microphone 102 and converted into an analog electrical signal. The analog electrical signal is converted into a digital signal by the ADC 104. The digital signal is then speech coded by the speech coder 106 using, for example, a vector sum excited linear prediction (VSELP) code. This speech coding compresses the digital signal.

The compressed digital signal may then be channel encoded by the channel encoder 108. The channel encoder's main function is to protect the digital signal against noise and fading inherent in a radio channel, such as is used for a cellular telephone system. The channel encoder 108 may perform several functions, such as convolution encoding, cyclic redundancy check (CRC) generation, interleaving the signal into appropriate slots, and burst generation. Each of these functions is briefly described.

Convolutional encoding provides error correction by adding redundancy to the transmitted signal. Convolutional encoding is described below in more detail. CRC is the addition of several bits (such as five or seven) to a block of important information bits in the transmitted signal. The value of the CRC code bits is used by a receiving decoder to determine whether or not an error exists in the received block of information bits. Interleaving is the division of the data from each frame of information bits into two transmit slots. Thus, if one slot is lost, it is unlikely that the second slot will also be lost. As a result, not all bits from a speech frame are likely to be lost. Burst generation is the time compression of the signal into a burst format.

Once the signal has been channel encoded, it is modulated onto a carrier frequency by the modulator 110 and transmitted via the transmitter and antenna 120. A preferred modulation method is differential quaternary phase-shift keying (DQPSK).

One method to improve the reliability of a telecommunications network is to add error control processing at the transmitting and receiving ends of the network. As discussed above, one method of doing this is using a channel encoder which adds redundancy to the transmitted signal so that a receiving decoder may make a decoding decision based on more than a single bit.

One common type of error control technique used in digital telecommunications networks is a convolutional code. A convolutional code is a code which provides n output symbols for each group of k input symbols. The code rate is defined as $R=k/n$. For example, if two symbols are output for every one input symbol, the code rate is ½. To reduce the bit rate of the transmitter, not all bits are coded in a convolutional code. Since the individual bits of information in a speech frame have varying sensitivity to error, some bits may be coded while other bits may not. For example, in a two class system, the sensitive bits may be grouped into one class called class 1 and convolutionally coded while the less sensitive bits are grouped into another class called class 0 and transmitted without coding. (Bit sensitivity is the loss of quality of the decoded speech signal due to corruption of the particular bit.) While convolutional encoding provides adequate redundancy for effective error control, it also increases the bandwidth of the signal because it adds a number of symbols to the transmitted signal. The inverse of the code rate is known as the bandwidth expansion. Thus, for a ½ code rate, the bandwidth expansion is 2, i.e., the bandwidth used by the signal is doubled.

FIG. 2 is an example 200 of a convolutional code with four states (00, 01, 10, 11) and a rate of ½. As seen in FIG. 2, each state may transition to two other states depending on whether the information bits is a 1 or 0. Note the transition (branch 202) from state 10 to state 01.

One way to improve the bandwidth expansion of convolutional codes is to "puncture" the code. Puncturing a convolutional code means that periodically a certain number of bits in the convolutional encoder are deleted at a fixed rate. This rate is called the puncture rate and results in a higher code rate. Because the bandwidth expansion is the inverse of the code rate, the closer the code rate is to 1, the lower the bandwidth expansion. By puncturing, error correction properties may be nearly the same as for an unpunctured (or "mother") code, but the higher code rate provides significant bandwidth savings.

Some mobile telephone systems, such as Europe's GSM system, use rate compatible punctured convolutional codes. In the GSM system, for example, a fixed rate of 456 information bits per frame is used for the traffic channel, 78 bits per frame are used for the synchronization channel, and 36 bits per frame are used for the random access channel. These fixed configurations permit coding parameters, such as number of information bits per frame, the code rate, and the puncture rate, to be stored in a memory for recall when needed.

Recently, the trend in digital cellular communications is toward scalable channel coders. For example, ITU Recommendation, "Annex C to G.723.1—Scalable channel coding scheme for wireless applications to be used with dual-rate speech coder for multimedia communications transmitting at 5.3 & 6.3 kbits/sec", November 1996 ("G.723.1 Annex C"), recommends a scalable channel coder. The contents of this document are incorporated herein by reference. Full scalability introduces new variables. First, the output bit rate adapts to changes in input parameters and available capacity. Second, the protection requirement for different bit classes varies. Third, the available channel capacity varies between minimum and maximum boundary conditions. As a result, a new set of coding parameters is determined according to a defined algorithm for each encoded (or decoded) frame.

The encoding process for a scalable punctured convolutional coder includes the following:
1. Partitioning the block of information bits (i.e., k bits) into several classes according to bit sensitivity, such as class 1 and class 2 bits. For example, G.723.1 Annex C, defines five different bit classes;
2. Coding each bit to be coded using a convolutional code having a rate k/n; and
3. Puncturing the output bit stream according to a predetermined rate compatible punctured convolutional code for the particular class.

These variable coding conditions per bit class are commonly referred to as unequal error protection schemes.

Three input variables for the rate compatible punctured convolutional coding are:
1. The number of bit classes the information bits have been partitioned into (this may be a fixed number);
2. The number of bits per frame to be coded (i.e., the number of k bits in each class to be coded); and
3. The available size of the output codeword based on available channel capacity. That is, the total number of bits n the current channel can accept.

For each combination of these input variables, there are the following scalable coding parameters to be determined:
1. The number of bits for each coding class per frame (i.e., the number of bits to be included in each class); and
2. The puncture code per class.

The puncture codes are a string of 1s and 0s mapping a periodic sequence of output bits from a convolutional encoder to a punctured sequence of those bits. A "0" indicates that a particular bit is "punctured", i.e., not transmitted. Puncture codes may be quite large and use as much as 3×16 bit words of memory for each code.

These parameters may be determined by a rate control algorithm proprietary to the specific channel coding specification. G.723.1 Annex C recommends that if the input variables change from one frame to the next, the rate control algorithm should be performed. This is disadvantageous because determining the coding parameters in real-time may be computationally intensive. For example, a non-optimal implementation of the rate control algorithm for G.723.1 Annex C on a Texas Instruments TMS320C5x DSP uses 6 MIPS of processing for each of the encoder and decoder stages. This may be performed many times during a single transmission, even as often as between each frame. As a result, real-time execution of the rate control algorithm is prohibitive.

Therefore, it is an object of the present invention to provide a method and device to provide the scalable coding parameters in real-time.

It is a further object of the present invention to provide the scalable coding parameters without computing the parameters in real-time and providing an economic advantage with regard to computational requirements.

It is yet a further object of the present invention to provide a method and device for storing and recalling the scalable coding parameters.

SUMMARY OF THE INVENTION

These and other objects of the present invention are provided by a three-dimensional code book. Preferably, a digital cellular device, such as a digital cellular telephone, using a scalable channel coding scheme includes a memory arranged as a three-dimensional code book. The three-dimensional code book may receive the following input variables:

1. The number of bit classes (this may be a fixed number);
2. The number of bits per frame to be coded (i.e., the number of k bits in each frame to be coded); and
3. The available size of the output codeword based on available channel capacity (i.e., the number of n bits the channel can currently accept).

For each of these input variables, the three-dimensional code book may output the following scalable coding parameters:
1. The number of k bits per frame partitioned into each of the coding classes; and
2. The puncture code per class.

Preferably, the memory is arranged in the following manner. A number of information bits to be coded is determined by a mode of the transmission signal. For each mode, entries are maintained for a range of redundant bits available on the channel for a particular mode. For each channel availability entry, the scalable coding parameters for each bit class are maintained. The invention provides the scalable coding parameters in real-time. It does this, however, without calculating the parameters in real-time.

In a preferred embodiment, the scalable coding parameters maintained in the code book includes the number of bits per frame for each class and an index to the appropriate puncture codes, rather than the puncture code themselves. The puncture codes, which may be quite lengthy are may be repeated many times in the three dimensional code book, may be stored in a separate table and linked to the code book via the index. As a result, each puncture code is only stored once and may be accessed via the puncture code index stored in the code book. This results in a very efficient use of memory space.

BRIEF DESCRIPTION OF THE DRAWINGS

The present invention is described with reference to the following figures:

FIG. 6B illustrates a puncture code table according to a preferred embodiment of the present invention.

DETAILED DESCRIPTION OF PREFERRED EMBODIMENTS

Overview of the Invention

Figure 3:
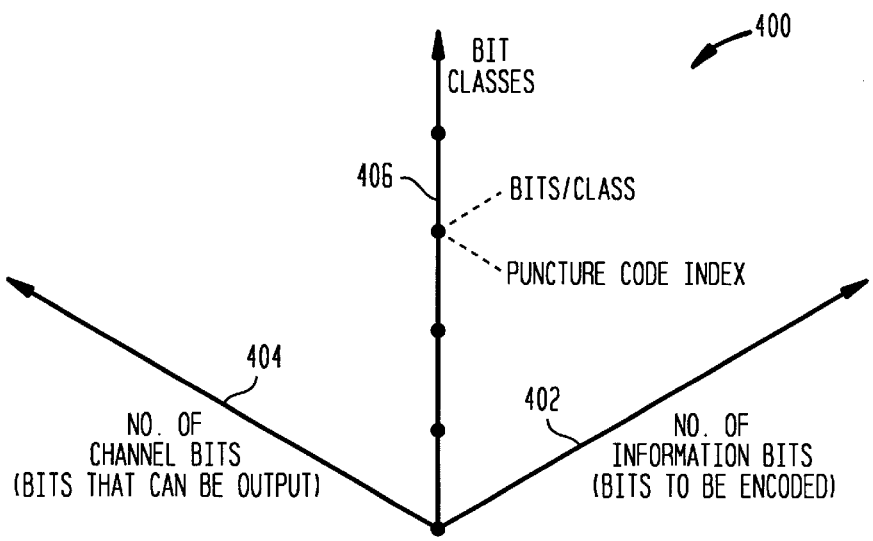
FIG. 3 is a graph illustrating a preferred embodiment of the three dimensional rate control input parameters and coding parameters.

FIG. 3 is a graph 400 illustrating the three dimensional rate control input and output coding parameters. As seen in FIG. 3, a first axis 402 represents the number of information bits to be encoded in a frame. A second axis 404 represents the number of bits the channel can currently accept. The values of either or both of these two axes may vary with time on a frame by frame basis during a transmission. Associated with these varying values is a number of bit classes, seen on a third axis 406. Typically, there are a finite number of bit classes, such as the five classes defined in G.723.1 Annex C. For each bit class there is associated a particular number of bits per class (i.e, the number of bits per frame which are to be partitioned into that particular class) and a puncture code for that particular class.

The invention is based on the property of the rate control algorithm that provides a discrete mapping of parameters along the bit class axis 406 for each of the other axes 402, 404. The appropriate coordinates of these three input variables lead to a memory location which provides the correct variables for the current number of information bits to be encoded and the current number of encoded bits which the channel may accept.

Figure 1:
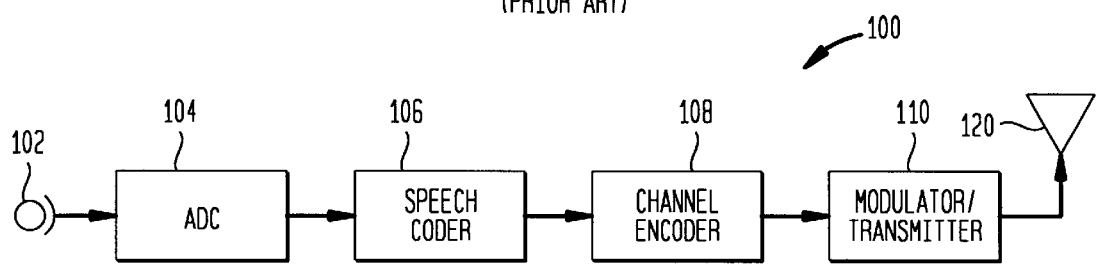
FIG. 1 is a simplified block diagram of the transmission portion of a conventional digital cellular device.
Figure 2:
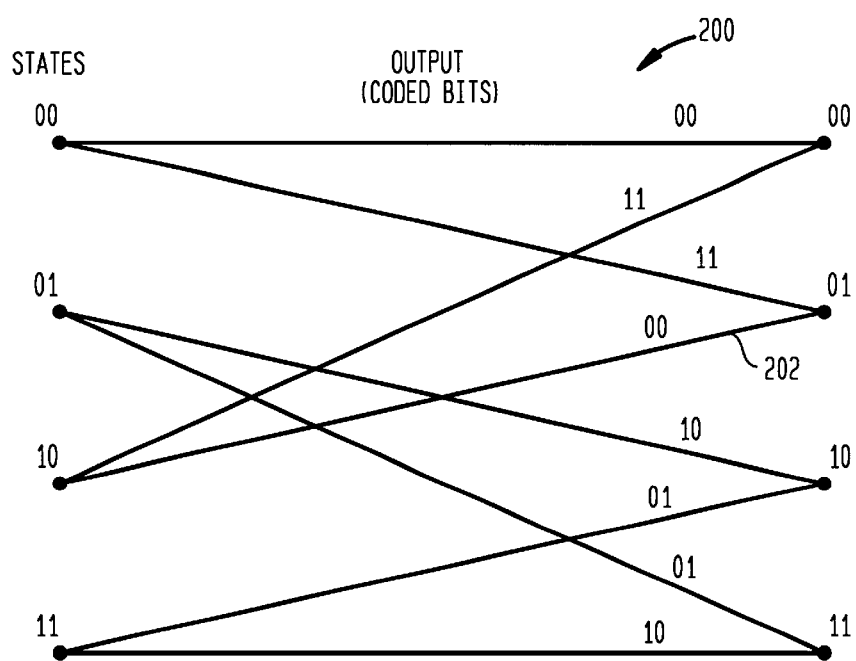
FIG. 2 is a diagram illustrating the operation of a conventional convolutional code.
Figure 4:
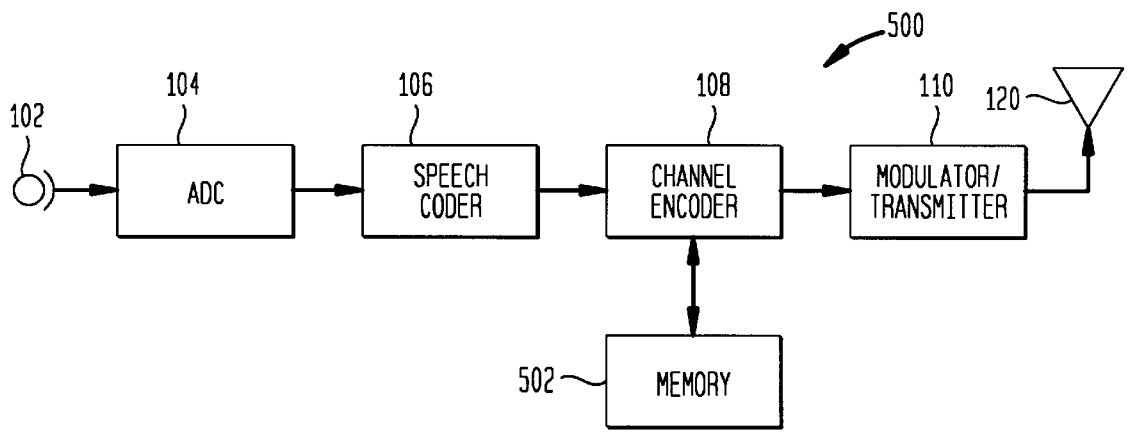
FIG. 4 is a block diagram of the transmission portion of a digital cellular device according to a preferred embodiment of the present invention.

FIG. 4 is a simplified block diagram of a transmission portion of a digital wireless communications device 500 according to a preferred embodiment of the present invention. The device 500 may be a digital cellular phone which may be used with a TMS320C5x digital signal processor made by Texas Instruments or other suitable processor. The device 500 is similar to the device 100 of FIG. 1. The device 500 according to the present invention, however, includes a memory 502 which may include a memory space arranged as a three dimensional code book and may also include a puncture code table, as discussed below.

As described in more detail below, the memory 502 is arranged in the following manner. A first dimension of the code book is the number of information bits (i.e., k bits) in a frame (see the first axis 402 of FIG. 3). The value of this first dimension is referred to as the "mode". For each mode, there is a range of possible redundant bits which the channel can currently accept. The number of redundant bits is derived from the channel capacity (see the second axis 404 of FIG. 3). The number of redundant bits is the parameter used as the second dimension in the code book. The third axis 406 defines the integral number of bit classes used for a particular coding scheme in conjunction with the parameters defined by the first and second axes. Thus, for each number of information and redundant bits within the range, there are associated scalable coding parameters for each of a number of bit classes. The coding parameters include: (1) the number of bits to be partitioned into that class; and (2) the puncture code for that class. The puncture code may be stored in the code book in the form of an index which is used to retrieve the puncture code from a second table. If the number of information bits to be coded, the number of codes bits the channel can accept, and the number of bits classes used are known, the appropriate coding parameters for each bit class may be obtained. These parameters are read out and supplied to the channel coder to solve the channel rate equation. The channel rate equation solution is used to channel code the transmission.

Structure and Operation of a Preferred Embodiment

The structure and operation of a preferred embodiment of the present invention involve the following definitions:

i=the number of source information bits from the speech coder in a frame to be coded;

I=the total number of bits to be coded by the convolutional coder; this includes all of the i bits and the CRC bits;

t=the number of tail bits used to set the convolutional coder to the zero state (convolutional codes use a number of tail bits at the end of the bit stream to set the encoder to a zero state);

a=the number of available channel bits;

r=the number of redundant bits available in the channel. Note that r=a−I; and

R=k/n, which is the convolutional coder rate where k is the number of information bits (which may be any bit being convolutionally coded, including an information bit, tail bit, or CRC bit) and n is the number of code bits output.

The maximum value of r for any mode is (1/R−1)×I. The minimum value of r for coding without convolution is 0, i.e., when a=I, that is, no redundant bits other than CRC bits are available in the channel. For convolutional coding to occur, r>t.

The memory 502 may include memory arranged as a three dimensional code book in the following manner. The third dimension is arranged as follows. The puncture code and number of bits in each class for a particular coding scheme using a particular number of bit classes (i.e., a finite element along axis 406) for each r value for each mode are calculated according to a particular rate control algorithm and saved. The puncture code may be identified according to an index position in the puncture code table set. Because scalable channel coders typically rely on using a range of puncture codes to provide the scaling to meet channel capacity (for example, G.723.1 Annex C uses 24 puncture codes), it is inefficient to store the puncture code in the code book for each coding condition. Rather, the present invention preferably provides a second memory arranged as a puncture code table in which each puncture code is stored and identified by its position in the table. The position in the table is referred to as the index. By storing the puncture code index in the code book and linking the code book to the code table, the index may be used to obtain and read the actual bits of a particular puncture code. By storing the puncture codes once in a separate table results in a very efficient use of memory space.

Figure 5:
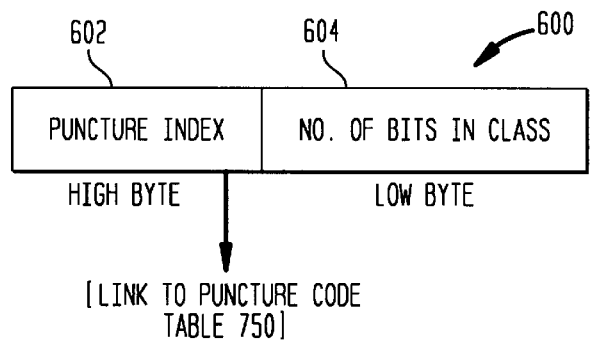
FIG. 5 illustrates a concatenated memory element according to a preferred embodiment of the present invention.

As seen in FIG. 5, the puncture code index and number of bits per class values may be stored in a single memory element 600. For example, the puncture code index 602 and the number of bits in the bit class 604 may be stored as a single entry. As described in detail below, the puncture code index 602 may be linked to a puncture code table. In a preferred embodiment, the memory element may contain a two byte value, with the puncture code index 602 as the most significant byte and the number of bits in the bit class as the least significant byte 604. Alternatively, larger coders and/or larger memory processors may concatenate the two parameters from two 16 bit words into one 32 bit word.

Figure 6A:
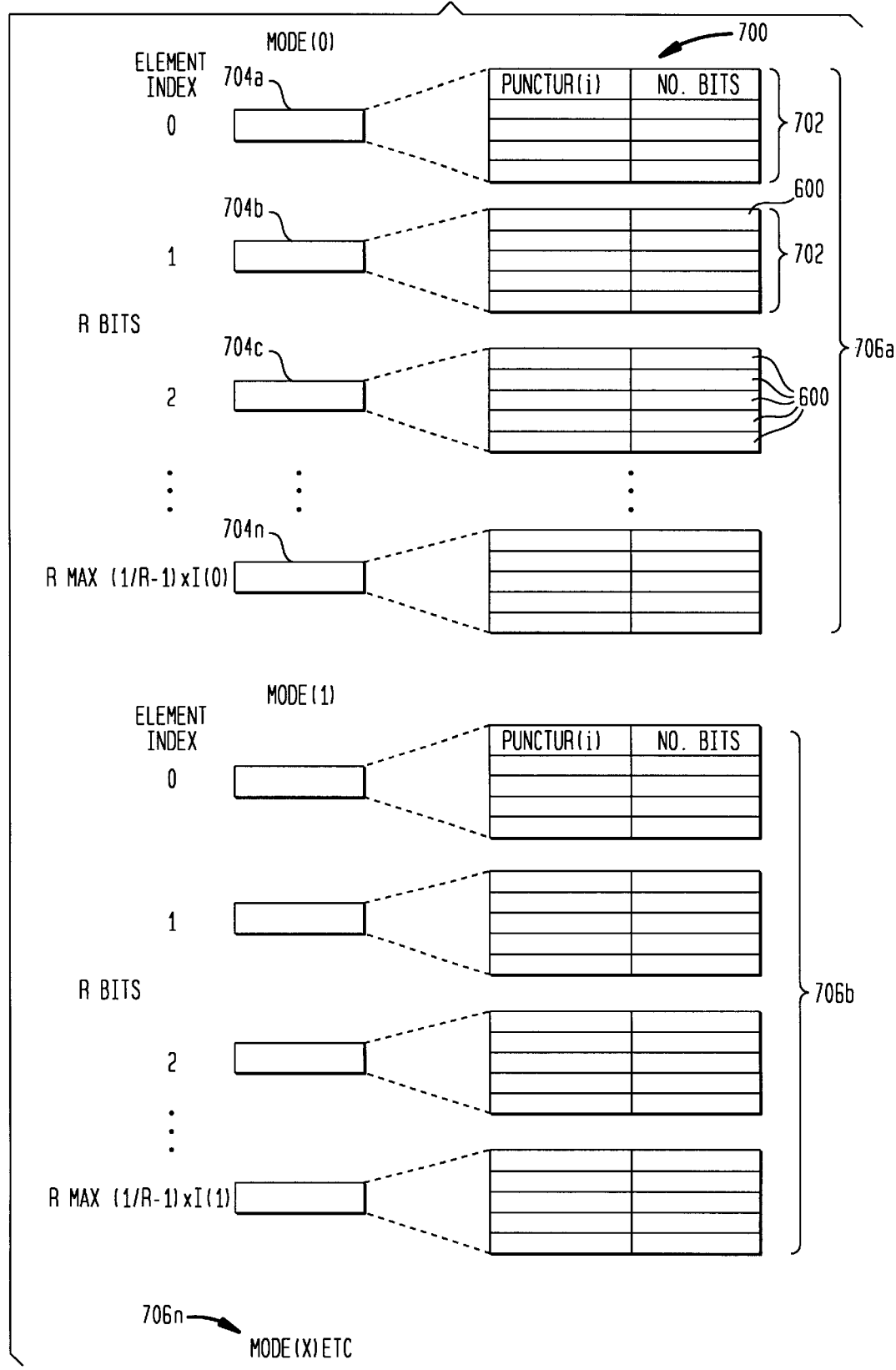
FIG. 6A illustrates a memory arranged as a three dimensional rate control code book according to a preferred embodiment of the present invention.

FIG. 6A is a block diagram illustrating a preferred embodiment of the three dimensional code book 700 found in memory 502. As seen in FIG. 6A, the second dimension is arranged as follows. Each bit class entry 600 is combined into a table 702 for each possible r value 704a–704n for a particular mode. The minimum r value is 0 and the maximum r value is (1/R−1)×I(Mode).

The first dimension is arranged as follows. Tables 702 for each r value are provided for each mode 706a–706n. The appropriate number of bits per class and puncture code (or puncture code index) for each class at a particular time while channel coding a digital cellular transmission may be obtained as follows, first the mode is determined (i.e., the number of bits to be coded). After the mode is determined, the number of redundant bits available in the channel is determined. Once these two values are determined, the appropriate number of bits and puncture code (or puncture code index) for each class may easily be obtained.

As readily seen in FIG. 6A, a great number of puncture code index entries may be found in the three dimensional code book 502. Because the puncture codes typically use a large amount of memory (such as 3×16 bit words each), storing the appropriate puncture code in each entry of the three dimensional code book 700 is an inefficient use of memory. As a result, in the preferred embodiment of the present invention, each of the puncture codes (for example, G.723.1 Annex C provides 24 puncture codes) is stored in a puncture code table.

FIG. 6B is a block diagram illustrating a preferred embodiment of a puncture code table 750 which may be found in the memory 502. The puncture code table 750 may be linked to the puncture code index values 602 stored in the three dimensional code book 700. The puncture code table 750 may store each of the puncture codes, such as the 24 puncture codes of G.723.1 Annex C.

The position of a particular code in the table is referred to as the index. The three dimensional code book 700 preferably stores a puncture code index in the memory elements 600. The index identifies the appropriate puncture code to be retrieved from the puncture code table 750. The three dimensional code book 700 preferably is linked to the puncture code table 750 and uses the puncture code index values to retrieve the appropriate puncture code.

The inventors have written computer code in the C language which determines the appropriate outputs for the G.723.1 Annex C rate control algorithm and generate the code book in an assembly language format suitable for use with, for example, the TMS320C5x DSP. The code book is stored in memory 502. In the TMS320C5x, the memory 502 includes a file entitled bitpunin.asm. This computer code comprises added lines to the G.723.1 Annex C rate control algorithm which cycles through all combinations in the 3D space, calculates the coding parameters, and stores them in the bitpunin.asm file. Attached as Appendix A is an abbreviated copy of this code with comments.

Figure 7:
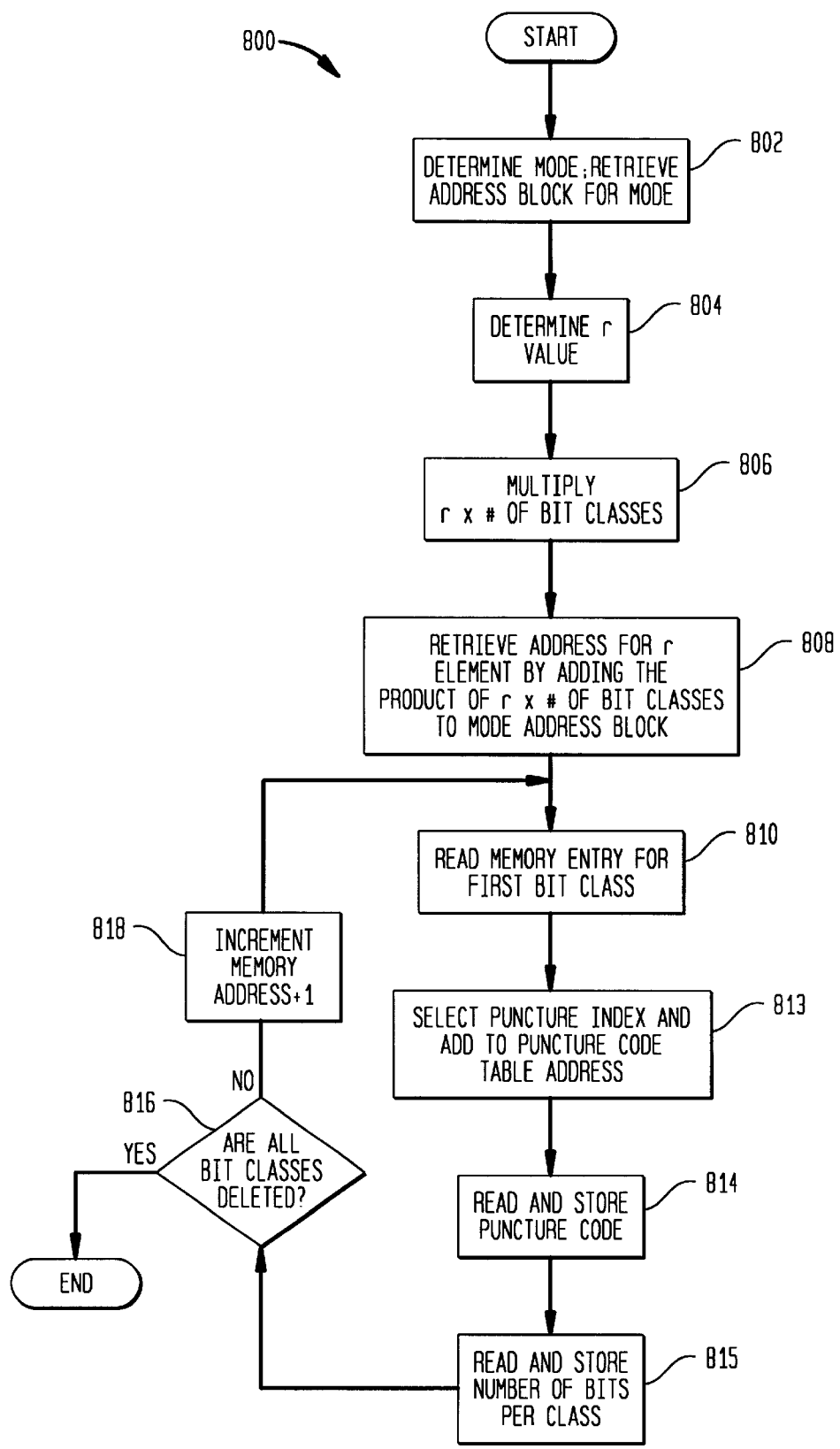
FIG. 7 is a flowchart illustrating a preferred method according to a preferred embodiment of the present invention.

FIG. 7 is a flow chart 800 illustrating a preferred method of channel coding a transmission in a digital cellular device which uses a rate compatible punctured convolutional code and an unequal error protection system. First, the mode is determined and the address for the block of memory 706n for that mode is retrieved (step 802). Next, the r value is calculated based on the given mode and available channel capacity (step 804). Then, the r value is multiplied by the number of bit classes to get to the correct position on that table, i.e., the beginning of the correct set of entries for that particular value of r in that mode. (step 806). The appropriate r value memory address is obtained by adding the product of (r×bit class) to the mode block address (step 808). The concatenated memory entries 600 for one bit class may be read out of memory (step 810) and provided to the channel coder 108 to solve the channel rate equation. The puncture index (high byte 602) is selected and added to the puncture code table address (step 812). The puncture code is read, for example by using the puncture code index to retrieve the appropriate puncture code from the puncture code table 750. The puncture code 750 may be stored in a temporary memory for use by the convolutional coder. This temporary memory may be RAM located in the memory 502 and may be reused each time new codes are decoded/extracted from the code book or puncture code table (step 814). Next, the number of bits per class (low byte 604) is read and stored in a temporary memory (step 815). Next, it is determined if all of the bit classes have been decoded (step 816). If no, the memory address is incremented by one (step 818) and steps 810–814 are repeated. If yes, the method ends. The decoded information may be used to solve the channel rate equation in order to channel code the transmission. The method may be performed each time there is a change in the input variables during a transmission.

The inventors have implemented this method using G.723.1 Annex C parameters. The implementation is in assembly code for the TMS320C5x DSP and stored in a file entitled chan_ini.asm. An edited copy of this code is attached as Appendix B.

In short, an improved manner for obtaining coding parameters for a scalable channel coding scheme is provided. Rather than repeatedly performing a channel rate algorithm, which may require many millions of instructions per second, the appropriate values are predetermined and stored in a memory. The memory is arranged as a three dimensional code book so that the appropriate parameters may be quickly obtained. Moreover, the puncture codes may be stored in a second table and accessed by a puncture code index. As a result, the lengthy puncture codes are stored only once, rather than stored in connection with each coding condition in which a particular puncture code is used. This provides efficient use of memory.

The above described embodiments of the invention are intended to be illustrative only. Many alternative embodiments may be devised by those skilled in the art without departing from the spirit and scope of the following claims. For example, the present invention has been described with reference to GSM G.723.1 Annex C. A person skilled in the art readily recognizes that the present invention may be used in connection with scalable channel coding for any source having unequal error protection and which adapts to channel and source conditions.

We claim:

1. A method for determining scalable channel coding parameters for transmitting and receiving in a digital communications device using a rate controlled punctured convolutional code and an unequal error protection system, the method comprising the steps of:
   a. determining a number of bits to be encoded;
   b. determining a number of encoded bits which may be accepted by a channel; and
   c. obtaining from a memory the scalable channel coding parameters for the determined number of bits to be encoded and determined number of encoded bits which may be accepted.

2. The method of claim 1, wherein the step of determining the number of bits to be encoded further comprises the step of determining a mode of the transmission.

3. The method of claim 2, wherein for each mode there is a range of values of numbers of encoded bits which may be accepted by the channel and for each value there are a predetermined number of bit classes each having an associated puncture code and number of bits to be encoded, the step of obtaining further comprising obtaining from the memory the puncture code and number of bits to be encoded for each of the bit classes for the determined mode and determined number of encoded bits which may be accepted by the channel.

4. The method of claim 3, wherein the step of obtaining from the memory the puncture code further comprises:
   a. obtaining a puncture code index from a first table; and
   b. using the obtained puncture code index, obtaining the puncture code from a second table.

5. The method of claim 1, further comprising providing the obtained parameters to a channel coder for solving a channel rate equation.

6. The method of claim 1, wherein the step of obtaining further comprises obtaining the scalable parameters from a single memory entry.

7. A method of channel coding onto a channel a transmission in a digital cellular device using a rate compatible punctured convolutional code and an unequal error protection system, the method comprising:

a. determining a mode of the transmission;

b. retrieving from a memory a memory block associated with the determined mode;

c. determining a number of redundant bits the channel may accept;

d. multiplying the determined number of redundant bits by a number of bit classes;

e. using a product of the multiplying step, obtaining a table of values in the retrieved memory block;

f. reading from the table scalable channel coding parameters;

g. using the read scalable channel coding parameters to solve a channel rate equation; and h. using the channel rate equation to at least one of channel code and channel decode the transmission.

8. The method of claim 7, wherein the step of reading from the table further comprises:

a. reading from the table a puncture code index; and b. using the puncture code index, reading a puncture code from a second table.

9. A memory in a digital cellular communications device for storing scalable channel coding parameters, comprising:

a. memory blocks corresponding to each of a plurality of transmission modes;

b. dividing each memory block into a number of tables, each table having values corresponding to one of a range of redundant bit availability values; and c. each table comprising scalable channel coding parameters for one of a plurality of bit classes.

10. The memory device of claim 9, wherein the scalable coding parameters include a puncture code index and a number of bits to be encoded in that bit class.

11. The memory device of claim 10, wherein the puncture code index and number of bits to be encoded are stored in a single memory element.

12. The memory device of claim 11, wherein the puncture code index and number of bits to be encoded are concatenated into a single memory element.

13. The memory device of claim 9, further comprising a puncture code table linked to table comprising scalable channel coding parameters.

14. The memory device of claim 13, wherein the puncture code table contains each of a plurality of puncture codes.

15. The memory device of claim 14, wherein each entry of the table comprising scalable channel coding parameters contains a puncture code index, each puncture code index corresponding to one of the plurality of puncture codes contained in the puncture code table.

* * * * *